United States Patent
Karnutsch et al.

(10) Patent No.: US 7,529,284 B2
(45) Date of Patent: May 5, 2009

(54) SEMICONDUCTOR OPTICAL PUMPING DEVICE FOR RADIATION EMISSION AND THE PRODUCTION METHOD THEREOF

(75) Inventors: Christian Karnutsch, Karlsruhe (DE); Norbert Linder, Wenzenbach (DE); Johann Luft, Wolfsegg (DE); Stephan Lutgen, Regensburg (DE); Wolfgang Schmid, Deuerling/Hillohe (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 454 days.

(21) Appl. No.: 10/526,214

(22) PCT Filed: Aug. 13, 2003

(86) PCT No.: PCT/DE03/02728
§ 371 (c)(1),
(2), (4) Date: Sep. 19, 2005

(87) PCT Pub. No.: WO2004/025796
PCT Pub. Date: Mar. 25, 2004

(65) Prior Publication Data
US 2006/0104327 A1  May 18, 2006

(30) Foreign Application Priority Data
Sep. 5, 2002 (DE) ................ 102 41 192

(51) Int. Cl.
*H01S 5/00* (2006.01)
(52) U.S. Cl. ............... 372/50.124; 372/50.22

(58) Field of Classification Search ............ 372/50.124, 372/50.22, 70
See application file for complete search history.

(56) References Cited

U.S. PATENT DOCUMENTS 3,484,713 A    12/1969   Fenner (Continued)

FOREIGN PATENT DOCUMENTS

DE          12 97 250          6/1969

(Continued)

OTHER PUBLICATIONS

D.B. Shire et al., "Gain controlled vertical cavity surface emitting lasers coupled with intracavity in-plane lasers", Appl. Phys. Lett. vol. 66. Nr. 14, pp. 1717-1719, Apr. 3, 1995.

*Primary Examiner*—Armando Rodriguez
(74) *Attorney, Agent, or Firm*—Cohen Pontani Lieberman & Pavane LLP

(57) ABSTRACT

An optically pumped, radiation-emitting semiconductor device having a semiconductor body which includes at least one pump radiation source (20) and a surface-emitting quantum well structure (11), the pump radiation source (20) and the quantum well structure (11) being monolithically integrated. The pump radiation source (20) generates pump radiation (2) for optically pumping the quantum well structure (11), a recess (10) for introducing the pump radiation (2) in the quantum well structure (9) being formed in the semiconductor body between the pump radiation source (20) and the quantum well structure (11).

30 Claims, 6 Drawing Sheets

U.S. PATENT DOCUMENTS

| | | |
|---|---|---|
| 5,513,203 A | 4/1996 | Damen |
| 5,748,653 A | 5/1998 | Kimmet et al. |
| 5,796,771 A | 8/1998 | Denbaars et al. |
| 6,535,537 B1 * | 3/2003 | Kinoshita ................ 372/50.11 |
| 6,687,280 B1 | 2/2004 | Kajita |
| 2002/0001328 A1 | 1/2002 | Albrecht |
| 2002/0075935 A1 | 6/2002 | Clayton |

FOREIGN PATENT DOCUMENTS

| | | |
|---|---|---|
| DE | 100 26 734 A1 | 12/2001 |
| DE | 101 08 079 A1 | 9/2002 |
| JP | 07 249824 A | 9/1995 |
| JP | 11186663 | 7/1999 |
| JP | 2001085790 | 3/2001 |
| JP | 2001358403 | 12/2001 |
| JP | 2002217488 | 8/2002 |

* cited by examiner

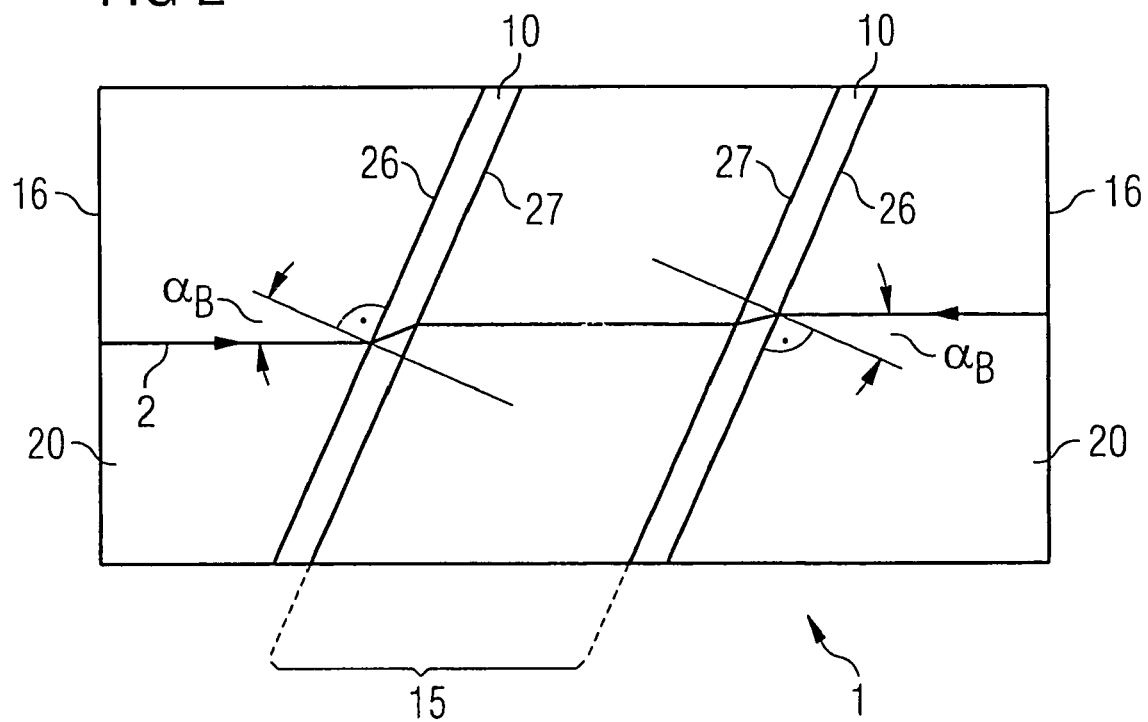

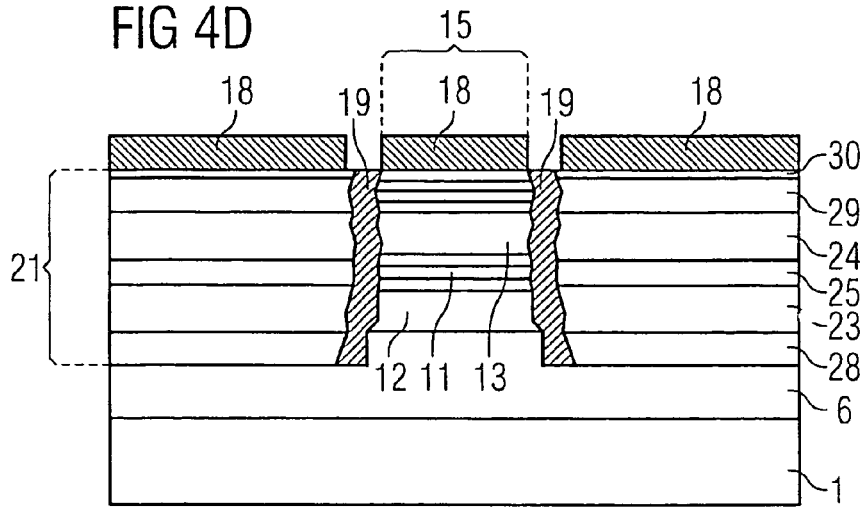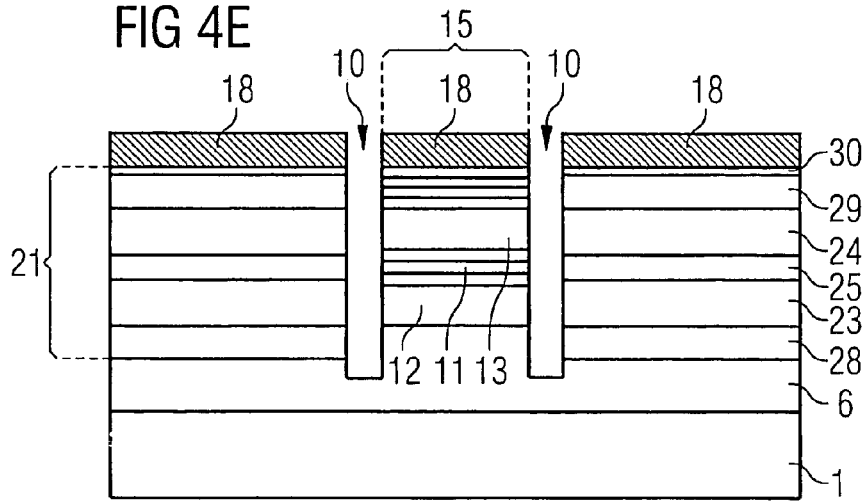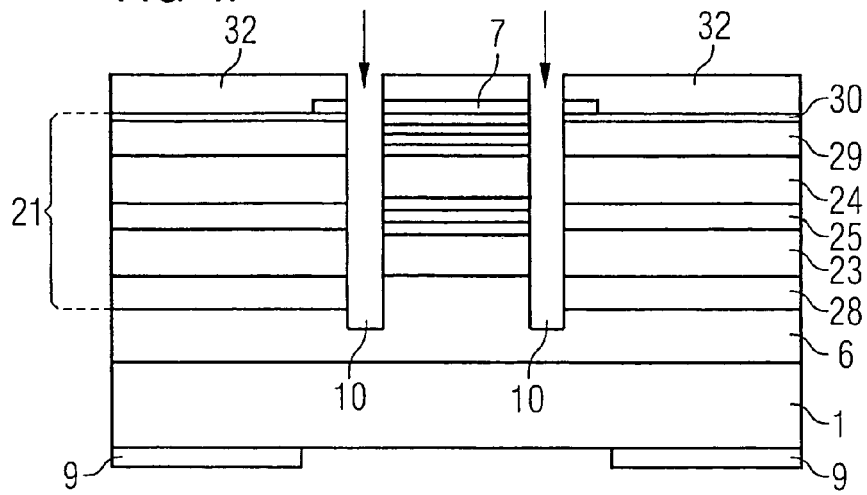

SEMICONDUCTOR OPTICAL PUMPING DEVICE FOR RADIATION EMISSION AND THE PRODUCTION METHOD THEREOF

RELATED APPLICATIONS

This is a U.S. national stage of application No. PCT/DE2003/002728, filed on 13 Aug. 2003.

This patent application claims the priority of German patent application no. 102 41 192.1, filed 5 Sep. 2002, the disclosure content of which is hereby incorporated by reference.

FIELD OF THE INVENTION

The invention relates to an optically pumped radiation-emitting semiconductor device and to a method for fabricating it.

BACKGROUND OF THE INVENTION

An optically pumped radiation-emitting semiconductor device is known, for example, from published U.S. patent application no. 2003/0001328, the content of which is incorporated by reference in the present description. The above document describes an optically pumped surface-emitting semiconductor laser device having a radiation-generating quantum well structure and a pump radiation source, for example a pump laser, for optically pumping the quantum well structure. The quantum well structure and the pump radiation source are grown epitaxially on a common substrate.

In a method for fabricating a semiconductor laser device of this type, first of all the quantum well structure is grown on a substrate in a first epitaxy step. Then, the quantum well structure is partially removed, for example by etching, and in a second epitaxy step the pump radiation source is grown onto the regions which have been uncovered in this way.

In this case, what is known as a grow-in region, the crystal structure of which has a relatively large number of crystal defects, may be formed during the second epitaxy step in the boundary region between the pump radiation source and the quantum well structure. Therefore, when the pump radiation is introduced into the quantum well structure, optical losses may occur in this grow-in region, reducing the efficiency of the semiconductor laser device.

SUMMARY OF THE INVENTION

One object of the present invention is to provide an optically pumped radiation-emitting semiconductor device having a quantum well structure and a pump radiation source, which are monolithically integrated, with improved efficiency, such as by reducing the losses that occur when introducing the pump radiation into the quantum well structure.

A further object of the invention is to provide a method for fabricating this semiconductor device.

These and other objects are attained in accordance with one aspect of the present invention directed to an optically pumped radiation-emitting semiconductor device having a semiconductor body which includes at least one pump radiation source and a surface-emitting quantum well structure, the pump radiation source and the quantum well structure being monolithically integrated, and the pump radiation source generating pump radiation for optically pumping the quantum well structure. A recess for introducing the pump radiation into the quantum well structure is formed in the semiconductor body between the pump radiation source and the quantum well structure.

In accordance with an embodiment of the invention, the recess is arranged in such a way that when it is being formed the grow-in region between the quantum well structure and the pump radiation source is removed. It has been found that the losses involved in introducing the pump radiation are advantageously reduced by means of a recess formed in a defined way of this type compared to the losses involved in introducing the pump radiation through the grow-in region described above.

The invention is suitable in particular for semiconductor devices in which the pump radiation source and the surface-emitting quantum well structure are formed from different semiconductor layer sequences.

These semiconductor layer sequences are preferably formed epitaxially and in succession on a common substrate. This has the advantage that semiconductor layer sequences for the pump radiation source and the surface-emitting quantum well structure can be independently matched to the prevailing requirements, for example different emission wavelengths.

In one refinement of the invention, the recess is in the form of a trench, the trench running perpendicular or obliquely with respect to a direction of propagation of the pump radiation, such as with respect to the main direction of emission of the pump radiation source. A recess in trench form is relatively space-saving and can be formed with little technical outlay during fabrication, for example, as an etched trench.

The recess can have a first side face and an opposite, parallel second side face, the pump radiation generated by the pump radiation source first of all being introduced into the recess through the first side face and then being introduced into the quantum well structure through the opposite second side face. The removal of the grow-in region during formation of the recess with defined side faces advantageously reduces the losses involved in introducing the pump radiation into the quantum well structure.

To avoid reflections at the side faces of the recess, the recess can be filled with a dielectric or a semiconductor material. This reduces the sudden change in refractive index at the side faces, and consequently reduces the reflection of the pump radiation at the side faces, thereby further increasing the amount of pump radiation which is introduced into the quantum well structure. The material for the filling of the recess can be selected in such a way that the refractive index is as far as possible similar or even equal to the refractive index of the adjoining semiconductor material, in particular in the region of the pump radiation source which carries pump radiation.

However, it may also be expedient to provide for defined reflection at the side faces of the recess, preferably at the side face which faces the pump radiation source. With a configuration of the invention of this type, the pump radiation source can be designed as a laser, in which case the reflecting side face simultaneously serves as a resonator mirror.

To reduce the reflection losses at the side faces, in a refinement of the invention, the side faces are arranged in such a way that they include an angle equal to the Brewster angle with a main emission direction of the pump radiation source. The Brewster angle $\alpha_B$ is given by the following relationship $$\tan \alpha_B = n_A/n_P$$

in which $n_A$ denotes the refractive index of the material located in the recess—which may also be air or another suitable gas—and $n_P$ denotes the refractive index of the adjoining semiconductor material of the pump radiation source within which the pump radiation propagates. Arranging the side faces at the Brewster angle with respect to the main emission direction of the pump radiation source minimizes the reflection losses for those components of the pump radiation which are polarized parallel to the plane of incidence (with respect to the side face of the recess).

In an aspect of the invention, it is preferable for the pump radiation source to be designed as a laser, in particular as an edge-emitting laser or as a ring laser. This results in strong focusing of the pump radiation with an accurately defined direction of propagation and a narrow spectral distribution. In this way, the pump radiation can be optimally designed for optical pumping of the quantum well structure and can be accurately radiated into the quantum well structure. Furthermore, the quantum well structure may also be arranged within a resonator of the pump laser.

In an aspect of the invention, the pump radiation is preferably introduced in the lateral direction into the quantum well structure, which means that the radiation emission of the quantum well structure takes place substantially vertically, i.e. perpendicular to the direction of propagation of pump radiation. Furthermore, the semiconductor device may be designed as a vertically emitting laser, for example as a VCSEL (Vertical Cavity Surface Emitting Laser) or as a disc laser.

Another aspect of the invention is directed to a method for fabricating an optically pumped semiconductor device having a semiconductor body which includes a surface-emitting quantum well structure and at least one pump radiation source which generates pump radiation for optically pumping the quantum well structure, the pump radiation source and the quantum well structure being monolithically integrated. A substrate is provided, and a plurality of semiconductor layers are epitaxially grown on the substrate, which layers include the quantum well structure. The semiconductor layers are partially removed, and the pump radiation source is epitaxially grown in the region uncovered by the removal step so that the pump radiation source adjoins the quantum well structure. A recess for introducing the pump radiation into the quantum well structure is formed between the pump radiation source and the quantum well structure.

In the absence of the present invention, the semiconductor layers of the pump radiation source can grow laterally together with the semiconductor layers of the quantum well structure, so that a grow-in region with a relatively strongly disrupted crystal structure is formed between the pump radiation source and the quantum well structure.

Then, a recess for introducing the pump radiation into the quantum well structure is formed between pump radiation source and quantum well structure. The grow-in region, which, on account of a relatively high crystal defect density may contribute to optical losses during introduction of the pump radiation, is at least partially removed, thereby improving the efficiency of introduction.

The recess can be etched into the semiconductor body. Both wet-chemical processes and dry-chemical processes, such as for example RIBE processes or CAIBE processes are suitable for this purpose. As has already been described, it is advantageous for the recess to be formed as an etched trench.

Another aspect of the invention is directed to a method for fabricating an optically pumped semiconductor device having a semiconductor body which includes a surface-emitting quantum well structure and at least one pump radiation source which generates pump radiation for optically pumping the quantum well structure, the pump radiation source and the quantum well structure being monolithically integrated. A substrate is provided, and a plurality of semiconductor layers are epitaxially grown on the substrate, which layers include the pump radiation source. A window is formed in the plurality of semiconductor layers for the quantum well structure, and the quantum well structure is expitaxially grown in the window so that the pump radiation source adjoins the quantum well structure. A recess for introducing the pump radiation into the quantum well structure is formed between the pump radiation source and the quantum well structure.

In the fabrication method, the recess can be filled with a semiconductor material or a dielectric in order to reduce the sudden change in refractive index between recess and adjoining semiconductor material and the associated reflection losses. By way of example, the recess may be filled with silicone.

One advantage of the two-step epitaxy presented above is in particular that it is thereby possible to produce the surface-emitting quantum well structure in undoped and electrically conductive form. Doping would generally lead to higher absorption losses in the surface-emitting quantum well structure.

BRIEF DESCRIPTION OF THE DRAWINGS

FIG. 2 shows a diagrammatic plan view of a second exemplary embodiment of a semiconductor device according to the invention.

DETAILED DESCRIPTION OF THE DRAWINGS

Components which are identical or have an equivalent function are provided with the same reference symbols throughout the figures.

Figure 1A:
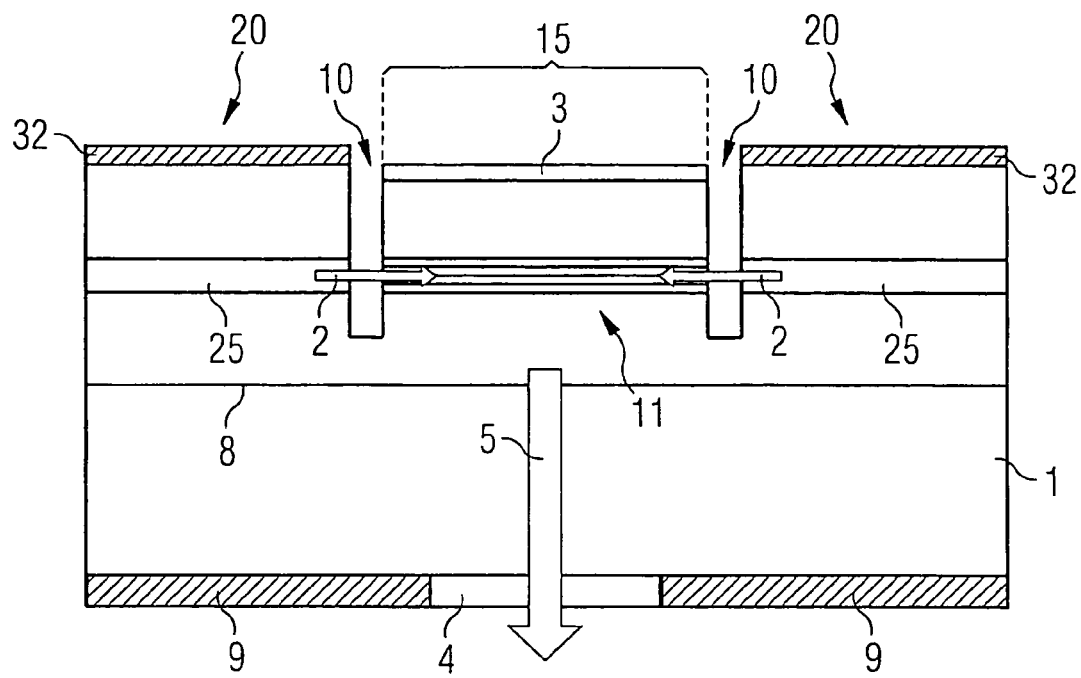
FIGS. 1a and 1b show a diagrammatic sectional illustration and a plan view of a first exemplary embodiment of a semiconductor device according to the invention.
Figure 1B:
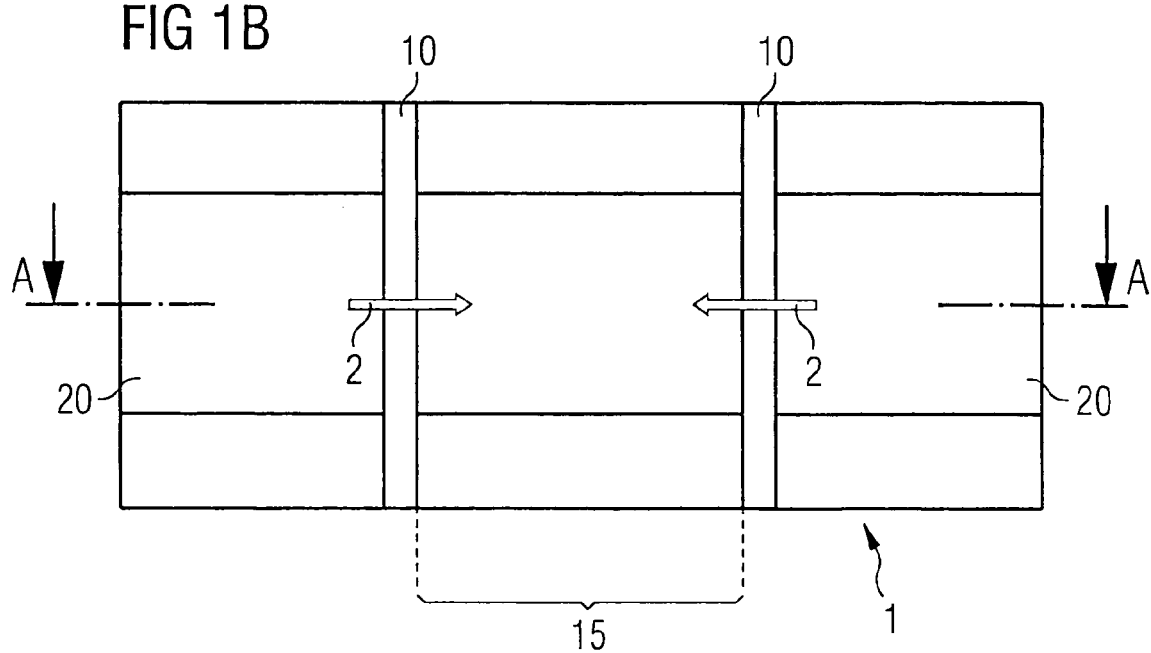

FIG. 1a illustrates a sectional view through an optically pumped radiation-emitting semiconductor device, and FIG. 1b shows the associated plan view. The section plane associated with FIG. 1a runs on line A-A in FIG. 1b. The semiconductor device has a semiconductor body which is arranged on a substrate 1 and comprises a surface-emitting region 15 and two pump radiation sources 20. A surface-emitting quantum well structure 11 in operation is optically pumped by the pump radiation sources 20 and generates radiation 5 that is emitted perpendicular to the surface 4 of the substrate 1 or the boundary surface 8 between the semiconductor body and the substrate 1. The quantum well structure 11 is formed in the surface-emitting region 15.

The pump radiation sources 20 are designed as edge-emitting semiconductor lasers which are electrically pumped in the usual way. For electrical power supply, a p-contact layer 32 is applied to the top side of the semiconductor body, and an n-type contact layer 9 is applied to the opposite side of the substrate. The edge-emitting semiconductor lasers each have an active radiation-emitting layer 25 which, in operation, emits pump radiation 2 laterally in the direction of the surface-emitting region 15 or of the quantum well structure 11.

The quantum well structure 11 within the surface-emitting region 15 is arranged at the same height above the substrate as the active layers 25 of the edge-emitting lasers. The result of this is that the pump radiation 2 generated by the semiconductor lasers is introduced as completely as possible into the quantum well structure 11, thereby optically pumping the quantum well structure with a high level of efficiency.

To increase the pumping efficiency, in the invention a recess 10 in the form of a trench is in each case formed between the pump radiation sources 20 and the surface-emitting region 15 having the quantum well structure 11.

Conventionally, when fabricating the semiconductor device shown, as will be described in more detail below, a plurality of semiconductor layers are applied to the substrate 1 in order to form the quantum well structure 11 and the pump radiation sources 20. This can form what is known as a grow-in region, in which the semiconductor layers of the pump radiation source 20 grow together in the lateral direction with the semiconductor layers of the quantum well structure 11. Since the crystal structure in the grow-in region is relatively strongly disturbed, increased scattering or absorption of the pump radiation 2 may occur in this region. The scattered or absorbed pump radiation 2 is therefore not available for optical pumping of the quantum well structure 11, and consequently, the pumping efficiency drops.

In the invention, a recess 10, for example in the abovementioned trench form, is formed by at least partial removal of the semiconductor material in the grow-in region. This advantageously reduces scattering or absorption of the pump radiation in the grow-in region and consequently increases the pumping efficiency.

FIG. 2 illustrates a plan view of a second exemplary embodiment of a semiconductor device according to the invention. The semiconductor device corresponds to the plan view shown in FIG. 1b, except that the recesses 10 in trench form run obliquely with respect to a direction of propagation of the pump radiation 2.

In this exemplary embodiment, it is particularly advantageous for the recess 10 to be formed in such a way that its side faces 26 and 27, i.e. the boundary surfaces between pump radiation source 20 or surface-emitting region 15 and recess 10, are parallel to one another and include an angle equal to the Brewster angle $\alpha_B$ with a main emission direction of the pump radiation source 20. For the transition between the semiconductor body and the recess, the Brewster angle $\alpha_B$ is given by the relationship $$\tan \alpha_B = n_A/n_P$$

in which $n_P$ denotes the refractive index of the semiconductor material of the pump radiation source 20, in particular of the layer carrying pump radiation, and $n_A$ denotes the refractive index of the material located in the recess 10. If appropriate, the recess may also be filled with a gas, for example air, or may be evacuated, in which case the refractive index $n_A$ is then approximately 1.0.

The arrangement of the side faces 26, 27 of the recess at the Brewster angle with respect to the main emission direction of the pump radiation source has the advantage that reflections of the pump radiation at the side faces of the recess are reduced, and in this way the pump efficiency is increased.

In this exemplary embodiment, it is preferable for the pump radiation source to be designed as an edge-emitting semiconductor laser, in which case the outer side faces 16 of the semiconductor body form the resonator mirror, and the surface-emitting region is arranged in the interior of the laser resonator formed in this way.

Figure 3:
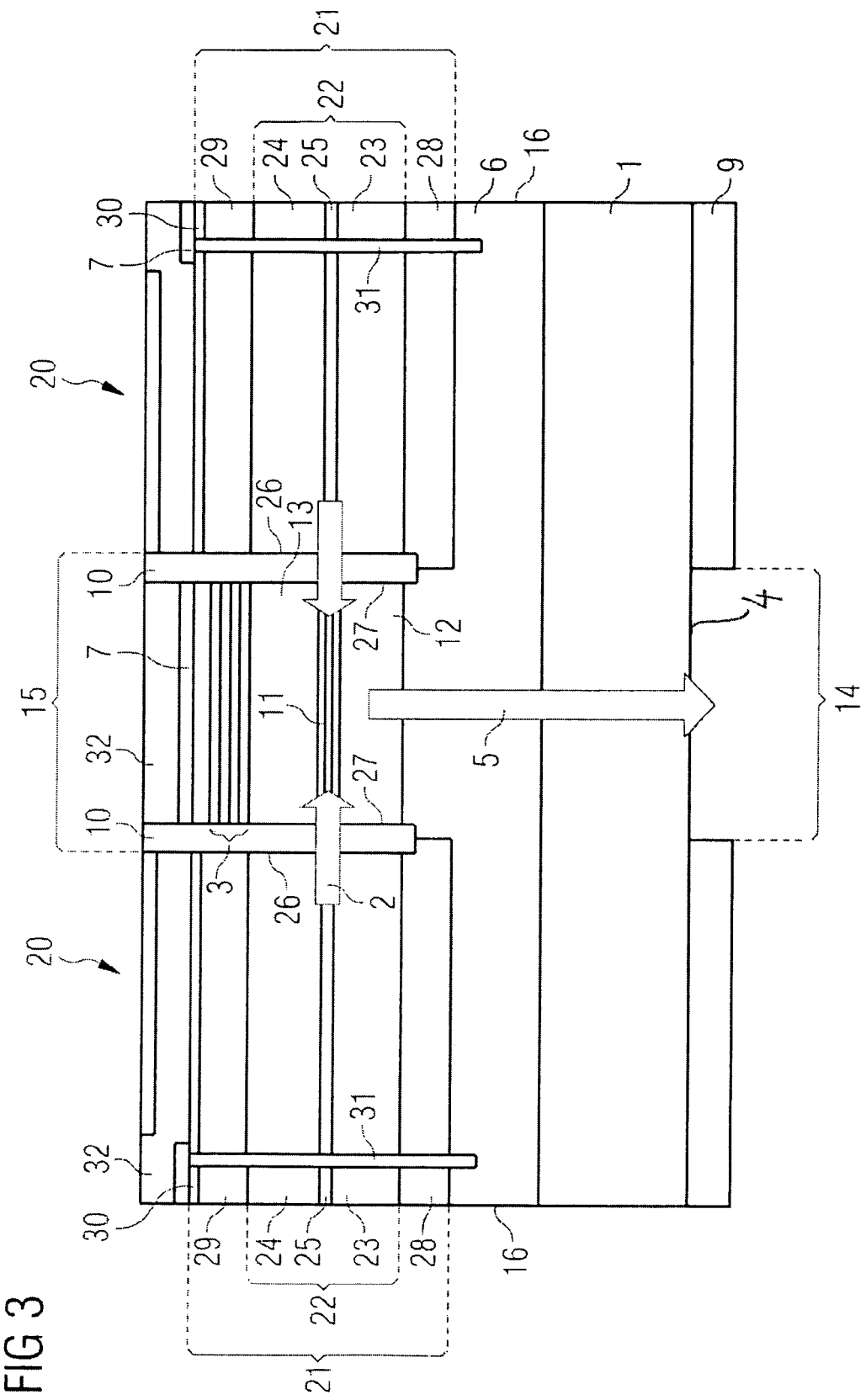
FIG. 3 shows a diagrammatic sectional illustration of a third exemplary embodiment of a semiconductor device according to the invention, FIGS. 4a to 4f diagrammatically depict a fabrication method according to the invention on the basis of six intermediate steps.

FIG. 3 illustrates a third exemplary embodiment of the invention in section. The structure corresponds to the exemplary embodiment shown in FIG. 1.

The semiconductor device illustrated has a substrate 1, to which a buffer layer 6 has been applied. The material used for the substrate may, for example, be GaAs, and the material used for the buffer layer may, for example, be undoped GaAs.

In the surface-emitting region 15, a first confinement layer 12, a quantum well structure 11 and a second confinement layer 13 are arranged in succession on the buffer layer 6. The confinement layers 12, 13 may, for example, contain undoped GaAs. The quantum well structure 11 preferably comprises three or more quantum wells with a thickness corresponding to a first emission wavelength for the radiation 5 that is to be generated by the quantum well structure, which quantum wells are spaced apart from one another by barrier layers. The quantum well structure is formed, for example, from InGaAs with a thickness corresponding to an emission wavelength of 1030 nm for the radiation 5 which is to be generated by the quantum well structure, and the barrier layers are formed, for example, from GaAs.

A Bragg reflector 3 is formed over the second confinement layer 13. This Bragg reflector may be formed, for example, by in each case 28 to 30 alternating layers (periods) of $Ga_{0.1}Al_{0.9}As$ and $Ga_{0.9}Al_{0.1}As$, respectively.

Two pump radiation sources 20, each in the form of an edge-emitting semiconductor structure 21, are arranged next to the surface-emitting region 15. The pump radiation 2 generated by the edge-emitting semiconductor structure 21 is introduced into the quantum well structure 11 in the lateral direction.

It is preferable for the edge-emitting semiconductor structures 21 to be designed as LOC (Large Optical Cavity) laser structures, each with a single quantum well (SQW) structure. An emission wavelength which is lower than the first emission wavelength for the radiation 5 that is to be generated by the quantum well structure is suitable for the pump radiation 2. For the data given hitherto, an emission wavelength of approximately 1000 nm is suitable for the pump radiation.

As seen from the substrate 1, the edge-emitting semiconductor structures 21 are each composed of a first cladding layer 28, for example of n-$Ga_{0.35}Al_{0.65}As$, which is applied to the buffer layer 6, a first wave-guide layer 23, for example of n-$Ga_{0.90}Al_{0.10}As$, an active layer 25, for example of undoped InGaAs in the form of an SQW-$Ga_{0.35}Al_{0.65}As$ layer, a second waveguide layer 24, for example of p-$Ga_{0.90}Al_{0.10}As$, and a second cladding layer 29, for example of p-$Ga_{0.35}Al_{0.65}As$. Finally, a covering layer 30, for example a $p^+$-doped GaAs layer is formed on the second cladding layer 29, and then the p-type contact layer 32 is formed on the covering layer 30.

The LOC structure 22 is formed by the two waveguide layers 23, 24 and the active layer 25 between them. The distance between this LOC structure and the substrate is such that the radiation-carrying layer 25 is arranged at the same height above the substrate as the quantum well structure 11, and consequently the pump radiation 2 which is generated is as far as possible radiated completely in the lateral direction into the quantum well structure.

The grow-in region has been removed between the pump radiation sources 20 and the surface-emitting region 15, so that a recess 10 is in each case formed between the pump radiation sources 20 and the surface-emitting region 15. It is preferable for the recess to be filled with a material which transmits the pump radiation. A silicone or a semiconductor material is particularly preferably used for filling. Furthermore, it is advantageous if this material has a refractive index which approximately corresponds to the refractive index of the adjoining pump radiation source and/or of the quantum well structure or the geometric mean of these two refractive indices.

In the case of the pump radiation sources 20, the refractive indices of the radiation-carrying layers are the crucial factor in the matching of the refractive indices. Refractive index matching of this type advantageously reduces refraction losses at the side faces of the recess 10.

It is preferable for the abovementioned semiconductor layers to be grown epitaxially on the substrate 1, for example by means of metalorganic vapor phase epitaxy (MOVPE).

In the vicinity of the respective outer side faces 16 of the pump radiation sources, mirror layers 31 which serve as an end mirror for the edge-emitting LOC laser structures 22 are formed running perpendicular to the layers of the edge-emitting semiconductor structures. Starting from the covering layer 30, these mirror layers extend at least into the first cladding layer 28, preferably, as illustrated, into the buffer layer 6. Mirror layers 31 of this type, after the growth of the semiconductor layers for the edge-emitting semiconductor structure, can be fabricated by first of all forming etched trenches by means of an etching process, for example reactive ion etching, with these trenches then being filled with a suitable reflective material.

Alternatively, it is also possible for the outer side faces 16 of the pump radiation sources 20, which in this case are preferably formed by cleaving the corresponding wafer, may also serve as end mirrors.

The edge-emitting laser structures may also be arranged in a common resonator delimited by the two mirror layers 31 or side faces 16, so that the quantum well structure is also located within this resonator. Alternatively, the outer side faces 26 of the recess 10, as seen from the quantum well structure 11, together with the associated mirror surface 31 or side face 16, may in each case form a resonator for the edge-emitting semiconductor lasers, so that the quantum well structure 11 is arranged between these two resonators. A further alternative is for the pump radiation source to be designed as a ring laser and for the quantum well structure to be arranged within the ring resonator.

An electrically insulating mask layer 7, for example a layer of silicon nitride, a layer of silicon oxide or a layer of aluminum oxide, is arranged on the free surface of the covering layer 30 and of the Bragg reflector 3, so as to define the current injection paths from the p-type contact layer 32, for example a contact metallization, into the pump radiation sources 20. The result of this is in particular that the pump current is only injected into the pump radiation sources 20, and therefore undesirable electrical pumping of the quantum well structure 11 is avoided.

On the opposite surface 4 of the substrate 1 from the quantum well structure 11 and the pump radiation sources 20, an n-type contact layer 9, for example a contact metallization is shaped to form an exit window 14. This exit window 14 is for the radiation 5 generated by the quantum well structure 11. Contact layer 9 is applied to correspond with p-type contact layer 32 to provide electrical contacts for the device, and in particular for pump radiation sources 20. It is preferable for the surface 4 of the substrate to be provided with an antireflection coating within the exit window 14, in order to reduce back-reflections of the radiation 5 emitted by the quantum well structure 11. Of course, the mention of n-type and p-type contacts refers to the corresponding semiconductor material, not necessarily to the contact layer itself having such conductivity type.

FIGS. 4a to 4f diagrammatically depict a method for fabricating a semiconductor device according to the invention in six intermediate steps. The semiconductor device to be fabricated substantially corresponds to that shown in FIG. 3.

Figure 4A:
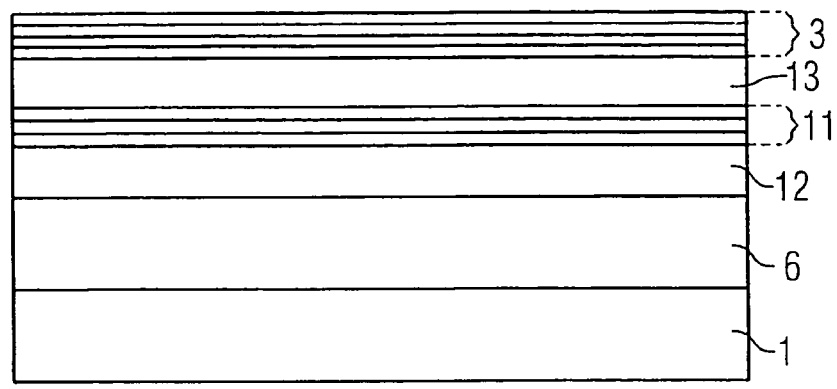

In a first step, FIG. 4a, the buffer layer 6, the first confinement layer 12, the quantum well structure 11, the second confinement layer 13 and the layers for the Bragg reflector 3 are successively grown onto the substrate 1, for example by means of a MOVPE process.

Figure 4B:
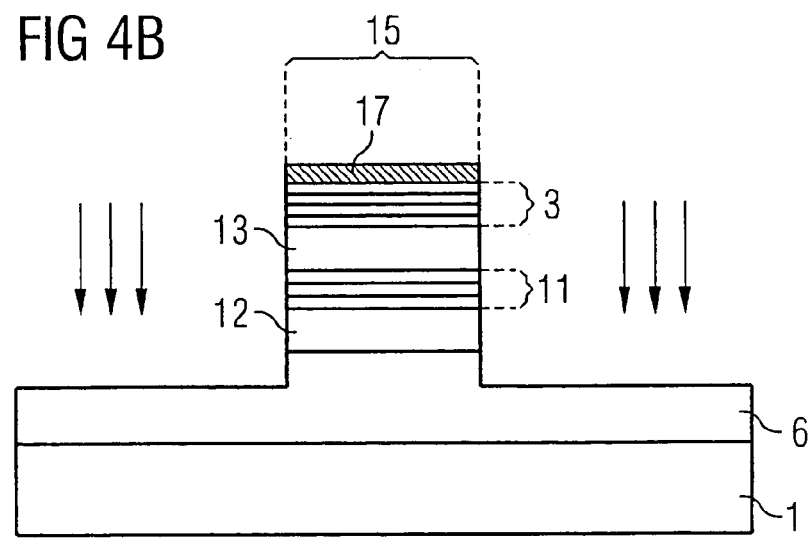

Then, in a second step, FIG. 4b, an etching mask 17, for example a silicon nitride mask, is applied in the region which is intended to form the surface-emitting region 15. Then, the layers for the Bragg reflector 3, the confinement layers 12 and 13, the quantum well structure 11 and part of the buffer layer 6 outside the surface-emitting region not covered by the etching mask 17 are removed by means of an etching process. By way of example, a dry-etching process is suitable for this purpose.

Figure 4C:
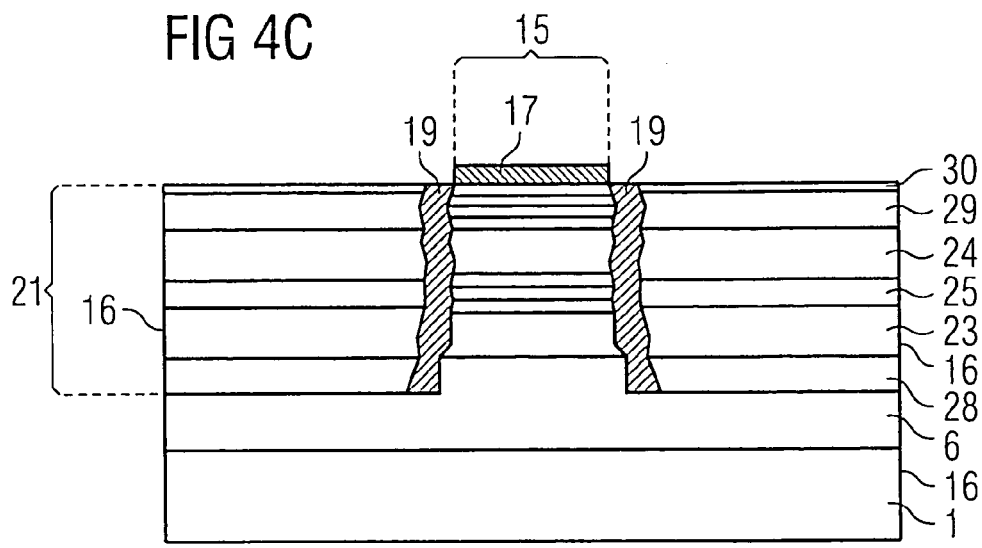

In a third step, FIG. 4c, to form the pump radiation sources 20 in the form of the edge-emitting semiconductor lasers described, the first cladding layer 28, the first waveguide layer 23, the active layer 25, the second waveguide layer 24, the second cladding layer 29 and the covering layer 30 are applied in succession, for example once again by means of a MOVPE process, to the regions of the buffer layer 6 which have been uncovered in this way.

In the process, these layers grow both in the vertical direction and also to a lesser extent in the lateral direction. This leads to the semiconductor layers of the pump radiation sources 20 growing together with the layers that have already been applied in the first step at the edge of the surface-emitting region 15. In this way, the grow-in region 19 is in each case formed between the surface-emitting region 15 and the pump radiation sources 20, which grow-in region 19, as has already been described, has a relatively strongly disturbed crystal structure and can have an adverse effect on the efficiency with which the pump radiation is introduced.

Unlike in the exemplary embodiment illustrated in FIG. 3, the end mirrors of the edge-emitting semiconductor lasers 21 are formed by the outer side faces 16 of the semiconductor body. At this point, it should be noted that for the sake of clarity FIG. 4 only illustrates the production of a single semiconductor device. In general, a plurality of semi-conductor devices of this type are produced simultaneously at wafer level, these devices still being connected in the lateral direction after step 4c, i.e. not having any side faces 16. Rather, the side faces 16 are produced by cleaving during division of the wafer assembly in a subsequent step of the fabrication method.

In a fourth step, FIG. 4d, an etching mask 18, for example a resist mask produced by photolithography, is applied to the covering layer 30, which etching mask 18 covers the covering layer 30 above the pump radiation sources 20 and the surface-emitting region 15 and thereby protects the semiconductor layers below. The etching mask 18 is recessed above the grow-in regions 19.

In a subsequent fifth step, FIG. 4e, the grow-in regions 19 are removed by means of an etching process. In this process, a recess 10 in the form of an etched trench is in each case formed between a pump radiation source 20 and the surface-emitting region 15, in particular the quantum well structure 11. A suitable etching process in this step is a wet-chemical process or a dry-chemical process, such as for example RIBE or CAIBE.

The etched trench can then be filled with a material which transmits the pump radiation, for example a silicone. For this purpose, the silicone is spun on, patterned by photolithography and then cured.

Finally, in a sixth step, FIG. 4f, the etching mask 18 is removed, and the electrically insulating mask layer 7 is applied to the covering layer 30 and the Bragg reflector 3, and then the p-type contact layer 32 is applied to the mask layer 7, and the contact layer 9 is applied to the opposite side of the substrate 1.

In an alternative method sequence to that described in conjunction with FIGS. 4a to 4f, first of all a layer sequence for the edge-emitting semiconductor laser 21 which constitutes the pump radiation source is grown onto the substrate, and then a window is formed in this layer sequence, for example by masking and etching. Then, the plurality of semiconductor layers for the surface-emitting region 15 are grown epitaxially in the window, these layers including, inter alia, the quantum well structure.

A grow-in region with a relatively strongly disturbed crystal structure is formed between the layer sequence for the edge-emitting semiconductor laser, i.e. the pump radiation source, and the semiconductor layers for the surface-emitting region 15.

In this method sequence, the further steps are carried out analogously to the steps explained in conjunction with FIGS. 4d to 4f.

Figure 5:
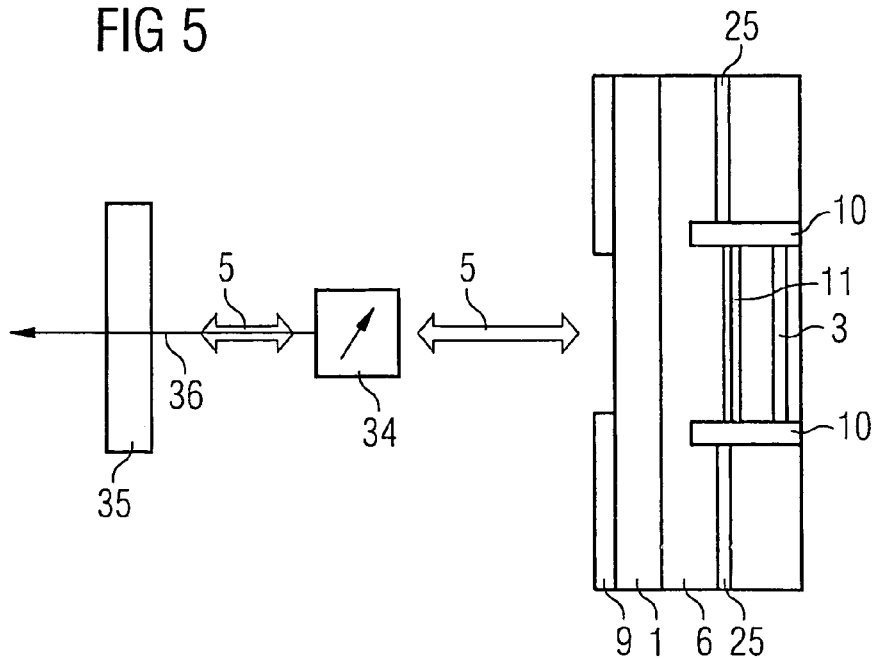
FIG. 5 shows a first exemplary embodiment of a laser arrangement with a semiconductor device according to the invention, and FIG. 6 diagrammatically depicts a second exemplary embodiment of a laser arrangement with a semiconductor device according to the invention.

FIG. 5 diagrammatically depicts an exemplary embodiment of a laser arrangement having a semiconductor device according to the invention.

The semiconductor device corresponds, for example, to one of the exemplary embodiments shown in FIGS. 1 to 3. An external mirror 35, which together with the Bragg reflector 3 of the semiconductor device forms the laser resonator of the laser arrangement, is arranged opposite the substrate 1 of the semiconductor device. The Bragg reflector 3 in this case forms the end mirror, and the external mirror 35 forms the coupling-out mirror of the resonator.

The coupling-out mirror 35 is preferably designed as a partially transmitting, dielectric mirror. It is also possible to use a partially transmitting metal mirror.

The optically pumped quantum well structure 11 of the semiconductor device, in which the laser radiation is generated and amplified by means of the optical pumping process, represents the laser-active region of the laser arrangement. It is preferable for a nonlinear optical element 34, in particular a nonlinear optical crystal, to be arranged within the laser resonator in the laser arrangement.

The nonlinear optical element 34 is used for frequency conversion of the laser radiation. In the process, electromagnetic radiation 36 of a different wavelength is generated from the laser radiation by a nonlinear optical process, such as for example sum frequency generation, generation of the second, third or a higher harmonic or differential frequency generation. It is in this way possible in particular, by generating cumulative frequency or a harmonic, to generate visible light of a shorter wavelength from the laser radiation, which for the abovementioned semiconductor lasers or quantum well structures is generally in the red or infrared region. Depending on the wavelength of the laser radiation and of the radiation to be generated, examples of suitable nonlinear media include KTP, KDP, BBO, KNB, LiNbO PPLN or LBO.

In this embodiment, it is preferable for the coupling-out mirror 35 to be formed as a dichroic mirror which substantially transmits the radiation generated by the nonlinear optical element 34 and substantially reflects the laser radiation. In particular dielectric coupling-out mirrors which can typically achieve a degree of reflection of more than 90% for the laser radiation and a degree of reflection of below 10% for coupling out the radiation generated by means of the nonlinear optical element 34 are suitable for this purpose.

Figure 6:
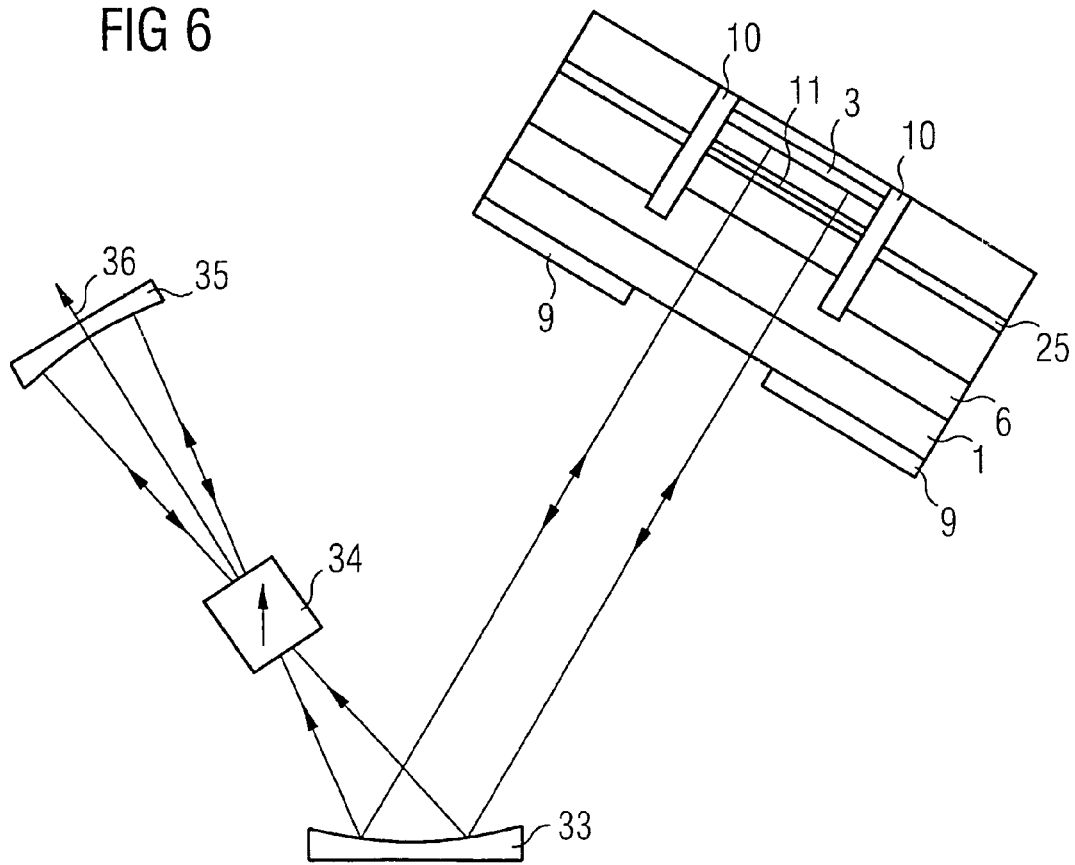

FIG. 6 shows a further exemplary embodiment of a laser arrangement having a semiconductor device according to the invention. Unlike in the exemplary embodiment shown in FIG. 5, the laser resonator is designed as a folded resonator. For this purpose, a further mirror 33 has been introduced into the beam path, so that the resonator axis is folded. The further mirror 33 and the coupling-out mirror 35 are curved concavely, so that a focal region in which the nonlinear optical element 34 is arranged is formed between the two mirrors. This focusing increases the intensity of the laser radiation generated by the quantum well structure 11 in the region of the nonlinear optical element 34 and consequently also increases the nonlinear conversion.

The explanation of the invention based on the exemplary embodiments and figures is not to be understood as any restriction to the invention. In particular, it is not imperative that precisely two pump radiation sources be provided in the invention. The semiconductor device may also have a single pump radiation source or more than two pump radiation sources, for example arranged in a star shape around the quantum well structure.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. An optically pumped radiation-emitting semiconductor device having a semiconductor body, the semiconductor body comprising:
   a surface-emitting quantum well structure;
   a pump radiation source constructed for generating a pump radiation for optically pumping the quantum well structure, the pump radiation source and the quantum well structure being in monolithically integrated form;
   wherein a recess for introducing the pump radiation into the quantum well structure is formed in the semiconductor body between the pump radiation source and the quantum well structure,
   wherein the pump radiation source is a pump laser comprising a resonator, and
   wherein the quantum well structure is arranged within the resonator of the pump radiation source.

2. The semiconductor device as claimed in claim 1, wherein the recess is in a trench form and runs obliquely or perpendicular with respect to a direction of propagation of the pump radiation.

3. The semiconductor device as claimed in claim 1, wherein the recess has a first side face facing the pump radiation source and an opposite, second side face facing the quantum well structure, the pump radiation entering the recess through the first side face and then entering the quantum well structure through the second side face.

4. The semiconductor device as claimed in claim 3, wherein the second side face is parallel to the first side face.

5. The semiconductor device as claimed in claim 3, wherein at least one of the first and the second side faces includes an angle equal to a Brewster angle with a direction of propagation of the pump radiation.

6. The semiconductor device as claimed in claim 1, wherein the recess is filled with a dielectric or a semiconductor material.

7. The semiconductor device as claimed in claim 1, wherein the recess is filled with a material which has a refractive index substantially equal to a refractive index of the pump radiation source, a refractive index of the quantum well structure or a geometric mean of the latter two refractive indices.

8. The semiconductor device as claimed in claim 1, wherein the semiconductor device comprises a vertical emitter with a radiation-generating region formed by the quantum well structure.

9. The semiconductor device as claimed in claim 8, wherein the vertical emitter is a vertically emitting laser.

10. The semiconductor device as claimed in claim 1, wherein the pump laser is an edge-emitting laser.

11. The semiconductor device as claimed in claim 1, wherein the pump laser is a ring laser.

12. The semiconductor device as claimed in claim 1, wherein the pump radiation is introduced into the quantum well structure in a lateral direction.

13. The semiconductor device as claimed in claim 1, wherein the pump radiation source and the surface-emitting quantum well structure are formed from different semiconductor layer sequences.

14. The semiconductor device as claimed in claim 1, wherein the pump radiation source and the surface-emitting quantum well structure are formed epitaxially and in succession.

15. The semiconductor device as claimed in claim 1, wherein the recess is arranged in a grow-in region between the pump radiation source and the surface-emitting quantum well structure.

16. The semiconductor device as claimed in claim 1, wherein the pump radiation source has at least one waveguide layer.

17. A method for fabricating an optically pumped semiconductor device having a semiconductor body which includes a surface-emitting quantum well structure and at least one pump radiation source which generates pump radiation for optically pumping the quantum well structure, the pump radiation source and the quantum well structure being monolithically integrated, the method comprising the steps of:
   a) providing a substrate,
   b) epitaxially growing a plurality of semiconductor layers onto the substrate, which layers include the quantum well structure,
   c) partially removing the semiconductor layers,
   d) epitaxially growing the pump radiation source in the region uncovered by the removal in step c) so that the pump radiation source adjoins the quantum well structure, and
   e) forming a recess for introducing the pump radiation into the quantum well structure, the recess being located between the pump radiation source and the quantum well structure,
   wherein the pump radiation source is a pump laser comprising a resonator, and
   wherein the quantum well structure is arranged within the resonator of the pump radiation source.

18. The method as claimed in claim 17, wherein step d) further comprises growing semiconductor layers to form the pump radiation source, these semiconductor layers in a grow-in region, being at least partially grown together in a lateral direction with the quantum well structure, and wherein step e) further comprises forming the recess by at least partial removal of the grow-in region.

19. The method as claimed in claim 17, wherein the recess is formed by etching.

20. The method as claimed in claim 17, wherein the recess is in a trench form.

21. The method as claimed in claim 17, wherein the recess is filled with a material which transmits the pump radiation.

22. The method as claimed in claim 21, wherein the recess is filled with a silicone or a semiconductor material.

23. A method for fabricating an optically pumped semiconductor device having a semiconductor body which includes a surface-emitting quantum well structure and at least one pump radiation source which generates pump radiation for optically pumping the quantum well structure, the pump radiation source and the quantum well structure being monolithically integrated, the method comprising the steps of:
   a) providing a substrate,
   b) epitaxially growing a plurality of semiconductor layers onto the substrate, which semiconductor layers include the pump radiation source,
   c) forming a window in the plurality of semiconductor layers for the quantum well structure,
   d) epitaxially growing the quantum well structure in the window so that the pump radiation source adjoins the quantum well structure, and
   e) forming a recess for introducing the pump radiation into the quantum well structure, the recess being located between the pump radiation source and the quantum well structure,
   wherein the pump radiation source is a pump laser comprising a resonator, and
   wherein the quantum well structure is arranged within the resonator of the pump radiation source.

24. The method as claimed in claim 23, wherein step d) further comprises growing semiconductor layers to form the quantum well structure, these semiconductor layers in a grow-in region, being at least partially grown together in a lateral direction with a layer sequence of the pump radiation source, and wherein step e) further comprises forming the recess by at least partial removal of the grow-in region.

25. The method as claimed in claim 23, wherein the recess is formed by etching.

26. The method as claimed in claim 23, wherein the recess is in the form of a trench.

27. The method as claimed in claim 23, wherein the recess is filled with a material which transmits the pump radiation.

28. The method as claimed in claim 27, the recess is filled with a silicone or a semiconductor material.

29. The semiconductor device as claimed in claim 3, wherein at least one of the first and the second side faces includes an angle equal to a Brewster angle with a main direction of emission of the pump radiation source.

30. The semiconductor device as claimed in claim 1, wherein the pump radiation source comprises an edge-emitting semiconductor laser, and wherein the semiconductor body has outer side faces forming resonator mirrors.

* * * * *